(12) United States Patent
Vaknin et al.

(10) Patent No.: US 11,936,404 B2
(45) Date of Patent: Mar. 19, 2024

(54) DATA AWARE COMPRESSION IN A STORAGE SYSTEM

(71) Applicant: VAST DATA LTD., Tel Aviv (IL)

(72) Inventors: Yogev Vaknin, Tel Aviv (IL); Alon Berger, Tel Aviv (IL); Itay Khazon, Tel Aviv (IL); Or Yahalom, Tel Aviv (IL)

(73) Assignee: VAST DATA LTD., Tel Aviv (IL)

( * ) Notice: Subject to any disclaimer, the term of this patent is extended or adjusted under 35 U.S.C. 154(b) by 222 days.

(21) Appl. No.: 17/661,264

(22) Filed: Apr. 28, 2022

(65) Prior Publication Data

US 2023/0353167 A1 Nov. 2, 2023

(51) Int. Cl.
*H03M 7/30* (2006.01)

(52) U.S. Cl.
CPC ....... *H03M 7/3088* (2013.01); *H03M 7/3062* (2013.01); *H03M 7/3068* (2013.01); *H03M 7/6047* (2013.01); *H03M 7/607* (2013.01); *H03M 7/6094* (2013.01)

(58) Field of Classification Search
CPC ............. H03M 7/3088; H03M 7/3062; H03M 7/3068; H03M 7/6047; H03M 7/6094; H03M 7/607
USPC ...................................... 341/51, 87
See application file for complete search history.

(56) References Cited

U.S. PATENT DOCUMENTS

| | | | | |
|---|---|---|---|---|
| 5,374,916 A | * | 12/1994 | Chu | ..................... H03M 7/3086 |
| | | | | 708/203 |
| 8,427,346 B2 | * | 4/2013 | Potkonjak | ............... H03M 7/30 |
| | | | | 341/51 |

* cited by examiner

*Primary Examiner* — Khai M Nguyen

(74) *Attorney, Agent, or Firm* — Reches Patents

(57) ABSTRACT

A method for storage system data aware compression, the method may include pre-compressing data units received by the storage system, by different pre-compression units to provide different pre-compressed versions of the data units; wherein the different pre-compression schemes are associated with different compression schemes, wherein at least some of the different compression schemes are data type specific compression schemes; calculating entropies of the different pre-compressed versions; and selecting a compression scheme out of the different compression schemes based on the entropies of the different pre-compressed versions.

21 Claims, 3 Drawing Sheets

DATA AWARE COMPRESSION IN A STORAGE SYSTEM

TECHNICAL FIELD

The present disclosure generally relates to the field of data storage, and more particularly to data aware compression in a storage system.

BACKGROUND

Storage systems often use lossless data compression algorithms on stored data for saving storage space, where the data is encoded into a smaller representation comparing to the original representation, which is achieved by taking advantage of statistical redundancy that is typical to data.

A data compression algorithm can be evaluated by the resulted compression ratio, which is a measurement of the relative reduction in size of the data after being compressed, compared to the uncompressed size.

Time-series data is a sequence of data points collected over time intervals, providing the ability to track changes over time. Though standard compression methods could be used for compressing time-series data, there exist specific compression algorithms that specifically address the case of time series by exploiting their characteristics to achieve a more effective compression. Compression algorithms for compressing time-series data can take advantage of the fact that most time-series datasets represent values that are slowly changing over time.

For images, a pixel consists of three components, specifying the three color-components of the pixel. It is expected that adjacent pixels will have a correlation between the bytes that corresponds to the same color, but no correlation is expected between two color bytes of the same pixel.

Since storage systems are not aware of the type of data being stored therein by external users, the storage systems often use a general-purpose compression on all the data—which may not be efficient.

It should be noted that even if the data is stored as files, a file extension may not indicate the type of the data. For example, when the file is an encapsulation of different types of files, or when the file extension is not recognizable. Therefore, the storage system may use general-purpose lossless compression units, such as Lempel-Ziv compression.

Though a general-purpose compression may suit various types of content and produce a good compression ratio, an improved compression ratio can be achieved for certain types of data if compressed by a dedicated type-based compression unit. For example, when applying time-series compression on time-series data, the compression ratio can reach over 90%. As for another example, good results can be achieved for using image compression on uncompressed images.

There is a need for an adaptive compression of data units received by a storage system.

SUMMARY

There may be provided a storage system, a method and a non-transitory computer readable medium for storage system data aware compression.

BRIEF DESCRIPTION OF THE DRAWINGS

The subject matter disclosed herein is particularly pointed out and distinctly claimed in the claims at the conclusion of the specification. The foregoing and other objects, features, and advantages of the disclosed embodiments will be apparent from the following detailed description taken in conjunction with the accompanying drawings.

DETAILED DESCRIPTION

Figure 1:
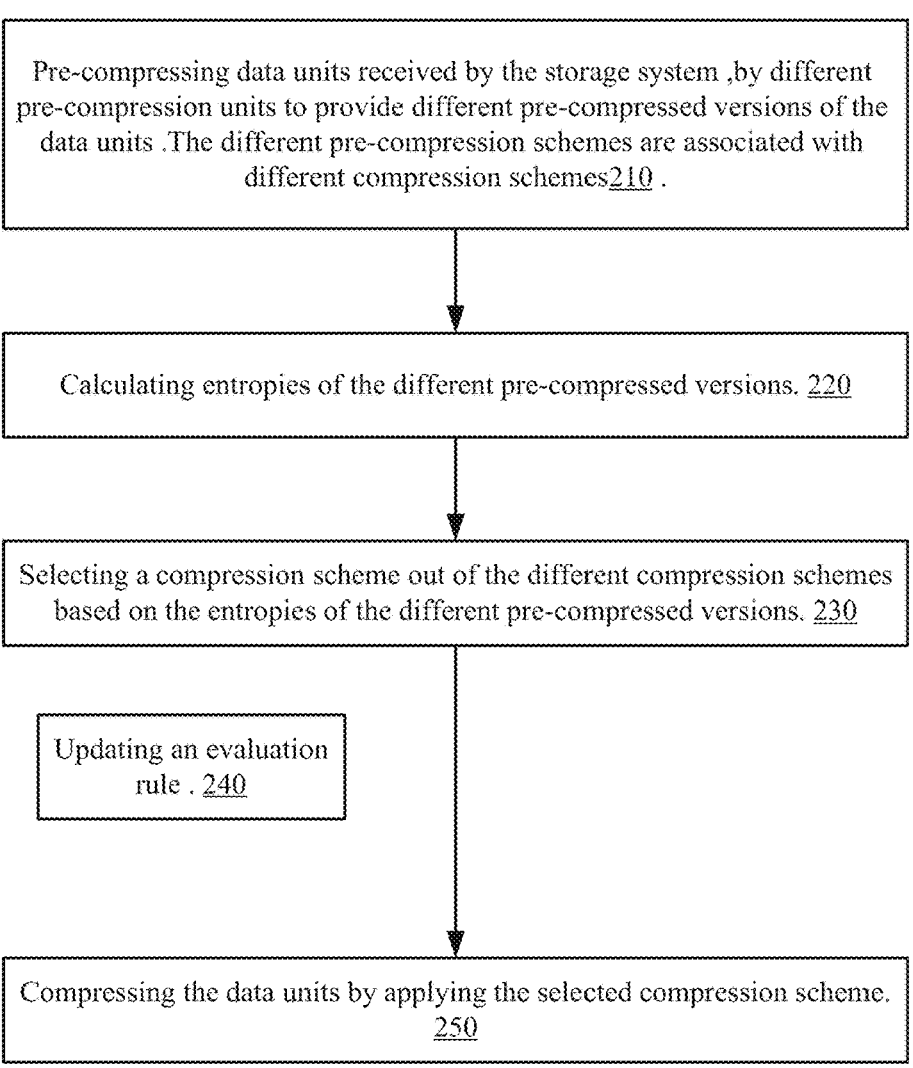
FIG. 1 is an example of a method

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a device or system capable of executing the method and/or to a non-transitory computer readable medium that stores instructions for executing the method.

Any reference in the specification to a system or device should be applied mutatis mutandis to a method that may be executed by the system, and/or may be applied mutatis mutandis to non-transitory computer readable medium that stores instructions executable by the system.

Any reference in the specification to a non-transitory computer readable medium should be applied mutatis mutandis to a device or system capable of executing instructions stored in the non-transitory computer readable medium and/or may be applied mutatis mutandis to a method for executing the instructions.

Any combination of any module or unit listed in any of the figures, any part of the specification and/or any claims may be provided.

The specification and/or drawings may refer to a controller. The controller can be a processing circuitry, a part of processing circuitry, a virtual machine core, and the like. The processing circuitry may be implemented as a central processing unit (CPU), a graphic processing circuitry (GPU), and/or one or more other integrated circuits such as application-specific integrated circuits (ASICs), field programmable gate arrays (FPGAs), full-custom integrated circuits, etc., or a combination of such integrated circuits.

Any combination of any steps of any method illustrated in the specification and/or drawings may be provided.

Any combination of any subject matter of any of claims may be provided.

Any combinations of systems, units, components, processors, sensors, illustrated in the application may be provided.

There may be provided a storage system, a non-transitory computer readable medium and a method for data aware compression in a storage system.

The storage system may select a compression scheme that suits characteristics of the data to be compressed, without any prior knowledge of the type of data, but rather by checking the entropy level of a pre-compressed version of the data, and by adjusting, according to sampled findings, the entropy measures that are used for evaluating whether the entropy level hints correspondence to a specific type-based compression.

The selecting may be based on a pre-compressed version of data units that undergo a pre-compressing step (also referred to as filtering) of transforming the uncompressed data to a format where it is more compressible, so that the compression unit can operate more efficiently. Different compression schemes may use different types of pre-compression steps, called filtering.

A filter may include separating the data to segments of several bytes each, comparing values of bytes in the segment to corresponding bytes (e.g., in the same positions) of an adjacent segment. For example, a PNG filter can separate the data to segments, where each segment describes one pixel, and may change the representation of data, to a series of differences. Time series filter may also use an approach of rearranging the data and changing the presentation.

The entropy of a dataset is a measure of the amount of information contained in the dataset. Entropy calculations can be used to get a theoretical bound on how much the dataset can be compressed. Higher entropy may mean that the compression scheme is not adequate.

According to embodiments of the invention, data (original data) that enters the system or already stored in the system, whose type is not known to the storage system, is processed by applying one or more pre-compression (filtering) processes associated with one or more compression schemes to be evaluated. For example, filters of time-series compression, and filters of image compression may be applied to produce a pre-compressed version of the original data, for each of the examined compression schemes. Only pre-compression is performed at this stage, for rearranging and/or reformatting the data, without compressing the data.

Entropy calculations are then applied on the pre-compressed versions of the original data of each of the examined compression schemes, so as to produce entropy values that represent entropy levels of the pre-compressed versions of the data for the one or more compression schemes.

An entropy measure is defined for evaluating whether the entropy level of a pre-compressed version of the data hint that the examined data presents characteristics of a certain type of data, that is expected to benefit from using a certain type-based compression.

The entropy measure may be an entropy threshold, that defines the level under which an entropy level presents a low entropy and is therefore considered as predicting a good conformance of the data to a data type associated with the pre-compression scheme. The entropy threshold may be composed from a vector of values, where each value is a threshold for a different segment out of multiple segments of the pre-compressed data. For example, a segment in a time-series data may be a column of bytes, where each byte is a portion of one value (e.g., integer) of one time point. A column that corresponds to the most significant bytes of the time values may present a very low entropy (e.g., all zeros), while a column that corresponds to the least significant byte of the time values may present a higher entropy. The entropy measure may be a function of multiple entropy thresholds, for example, each threshold corresponds to a different segment and associated with a different weight in a weighted sum function.

The calculated entropy levels are compared to the entropy test measure of the specific pre-compression scheme that produced the pre-compressed data, so as to evaluate whether the data passed the entropy test.

Calculated entropy levels that pass the entropy test hint that the corresponding type-based compression may be the desired compression, and the data is tagged with this type-based compression, for example, by adding an indication to a metadata of the data block, indicating that the block may be a candidate for compressing using the corresponding type-based compression.

If none of the entropy levels, calculated for different type-based compressions, found to have an acceptable entropy, the data is compressed using a general-purpose compression. If more than one entropy values pass the entropy test, the type-based compression that corresponds to the best performing entropy value—is chosen for at least tagging the data block. The best performing entropy value is the value that presents the lowest entropy.

The pre-compression of data, the entropy levels calculation and the entropy test—may be performed to all blocks, or only to sampled data. For example, every Xth (e.g., 100th) block of X consecutive stored data blocks is selected, and few sampled bytes of this block are examined.

The gap between sampled blocks (the number of blocks between checked blocks) may be adjusted according to the results. For example, if after several tests, all the sampled blocks present conformance to a certain data type, then the gap between selected blocks may be increased. Yet for another example—when determining that the searching for an appropriate compression scheme does not converge—especially when non-consistent results are obtained—the gap may increase—for example for skipping a certain file or a certain part of a file (for example—when no conformance is found, the gap between tested blocks is increased, so that less blocks are checked, for example, for every 1000, 3000, 5000 blocks—one block is checked). Non-consistent results may be results of consecutive samples of tested blocks that suggests different compression schemes, for example, after one result that suggests a time series compression, follow ten results that suggest general-purpose compression, or any other mix of results.

Any increment or decrement of the gap between tested blocks may be by any factor—2, 5, 10, 20 and even more (e.g., increasing from testing every 10th block instead of every 100th block), so that more blocks are selected to be tested. The tests (along with the pre-compressing and entropy calculation) may be limited to testing only the type of the successful test.

The tagging of the blocks as being candidates for a type-based compression is being validated, by evaluating the efficiency of the type-based compression. At least part of the tagged blocks (e.g., every 10th tagged block) is compressed twice: using the type-based compression indicated by the tag, and further using the general-purpose compression on the same data. The compression ratios resulted from the two compression processes are compared for determining the contribution of using the type-based compression.

According to embodiments of the invention, the entropy measure is adaptable and being tuned, according to the results of the compression ratios resulted from the two compression processes.

If the compression ratio of the type-based compression is not improved when comparing to the general purpose compression, by at least a certain first level of improvement (e.g., at least 3%, 5%, or 10% improvement is achieved), then the entropy measure associated with the type-based compression that was used for compressing the tested data—are tightened (rigidified), so as to increase the probability of data, whose entropy values pass the entropy measure, to conform to the corresponding data type. For example, lowering an entropy threshold, so that less data samples pass the entropy measure.

If, on the other hand, the compression ratio of the type-based compression is significantly improved when comparing to the general-purpose compression, for example, by at least a certain second level of improvement (that is higher than the first level of improvement, e.g., at least 15%, 20% or higher improvement is achieved), then the entropy measure associated with the type-based compression that was used for compressing the tested data—are loosened, so as to allow more data to pass the entropy measure and to conform to the corresponding data type. For example, elevating the entropy threshold, so that more data samples pass the entropy measure.

The compression evaluation may include sampling blocks out of the blocks that are tagged with a type-based compression, for example, the compression evaluation is performed for every 10th, 100th, 1000th or more of the tagged blocks.

Tagged blocks that successfully passed the compression evaluation, along with blocks that were not sampled but are stored in the vicinity (e.g., stored consecutively) of the tagged blocks that pass the test—are compressed using the type-based compression.

FIG. 1 illustrates method 200 for data aware compression in a storage system.

Method 200 may include step 210 of pre-compressing data units received by the storage system, by different pre-compression schemes to provide different pre-compressed versions of the data units. The different pre-compression schemes are associated with different compression schemes, e.g., if a certain compression scheme is to be evaluated, the data is pre-compressed by using a corresponding pre-compression scheme that would arrange the data in a form that would facilitate a better compression rate by the certain compression scheme, if the resulted entropy is low.

At least some of the different compression schemes are data type specific compression schemes.

A data unit may be of any size or format—for example a block, a chunk, a frame and the like.

Step 210 may be applied on data units after being received by the storage system—before or after the data unit is stored in a storage node and/or in a non-volatile memory unit of the storage system.

Step 210 may be followed by step 220 of calculating entropies of the different pre-compressed versions.

Step 220 may be followed by step 230 of selecting a compression scheme out of the different compression schemes based on the entropies of the different pre-compressed versions.

Step 230 may include evaluating whether to apply a general-purpose compression scheme or to apply one of the data type specific compression schemes.

The evaluating may be based on a relationship between (a) a compression ratio obtained when using the general-purpose compression scheme, and (b) a compression ratio obtained when using a data type specific compression scheme.

The evaluating may be based on an evaluation rule. The evaluation rule may define an entropy requirement for passing the test, the way the entropy of the pre-compressed data is tested, such as the entropy threshold to be compared to the entropy of the pre-compressed data, the entropy level of the pre-compressed data that passes or fails the test, etc.

The method may include updating (step 240) the evaluation rule. The updating may be responsive to the outcome of step 230—to the outcome or multiple iterations of step 230, may be responsive to the relationship of compression ratios—or to other parameters.

Step 240 may include:
a. Tightening an entropy requirement for selecting the data type specific compression scheme when selecting to use the general-purpose compression scheme. General-purpose compression scheme is selected over the data type specific compression scheme, when the data type specific compression scheme is not adequate according to the evaluation of the compression rates of step 230.
b. Loosening an entropy requirement for selecting the data type specific compression scheme when selecting to use one of the data type specific compression schemes.

Step 230 may be followed by step 250 of compressing the data units by applying the selected compression scheme.

Figure 2:
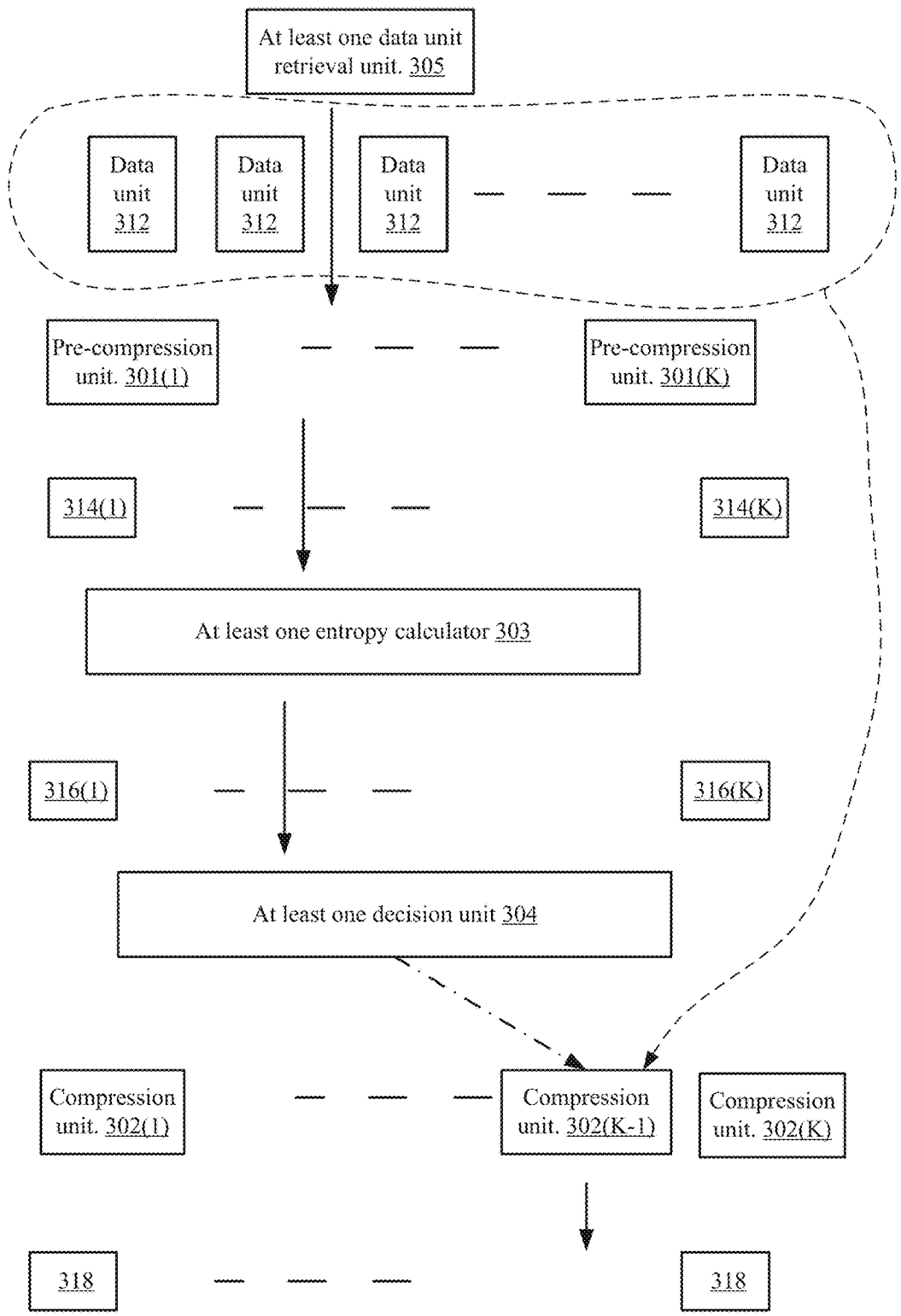
FIG. 2 is an example of a computerized device of a storage system.

FIG. 2 illustrates a computerized device 300 that may belong to a storage system. FIG. 2 also illustrates examples of various data structures.

The computerized device 300 includes (i) pre-compression units 301(1)-301(K), (ii) compression units 302(1)-302(K), (iii) at least one entropy calculator 303, (iv) at least one decision unit 304, and (v) at least one data unit retrieval unit 305.

The pre-compression units and the compression units are associated with K different compression schemes. For simplicity of explanation it is assumed that for k between 1 and K, the k'th compression unit and the k'th pre-compression are associated with a k'th compression scheme.

The K different compression schemes may include a general-purpose compression scheme and (K−1) other compression schemes—that may include data type specific compression schemes.

It is assumed, for simplicity of explanation, that pre-compression unit 301(K) is a general purpose pre-compression unit associated with a general-purpose compression scheme, and that precompression units 301(1)-301(K−1) are data type specific compression units associated with different (for example K−1) compression schemes, though a general purpose pre-compression unit may be omitted, and only data type specific compression units may be used.

It should be noted that while the following example refers to two types of compression—general purpose and data type specific compression schemes—there may be more than two types—for example a compression scheme may be applicable to two or more types of data while not being a general-purpose compressions scheme.

It should also be noted that at least one compression unit may apply more than one compression scheme and/or that at least one pre-compression unit may apply more than one precompression schemes.

The at least one data unit retrieval unit 305 is configured to obtain data units 312 and provide the data units to the pre-compression units 301(1)-301(K).

The pre-compression units 301(1)-301(K) are configured to pre-compress data units 312 by different (for example K) compression schemes to provide different pre-compressed versions 314(1)-314(K) of each of the data units. The pre-compression units 301(1)-301(K) are configured to execute step 210.

The at least one entropy calculator 303 is configured to calculate entropies 316(1)-316(K) of the different pre-compressed versions. The at least one entropy calculator 303 is configured to execute step 220.

The at least one decision unit 304 may be configured to select a compression scheme out of the different compression schemes based on the entropies of the different pre-compressed versions. In FIG. 2 it is assumed that the (K−1)'th compression unit is selected. The at least one decision unit 304 may be configured to execute step 230.

The at least one decision unit 304 may be configured to update the evaluation rule based on the relationship of the compression ratios. The at least one decision unit 304 may be configured to execute step 240.

A selected compression unit of compression units 302(1)-302(K) is configured to compress the data units by applying the selected compression scheme—to provide compressed data units 318. The selected compression unit may be configured to execute step 250.

Figure 3:
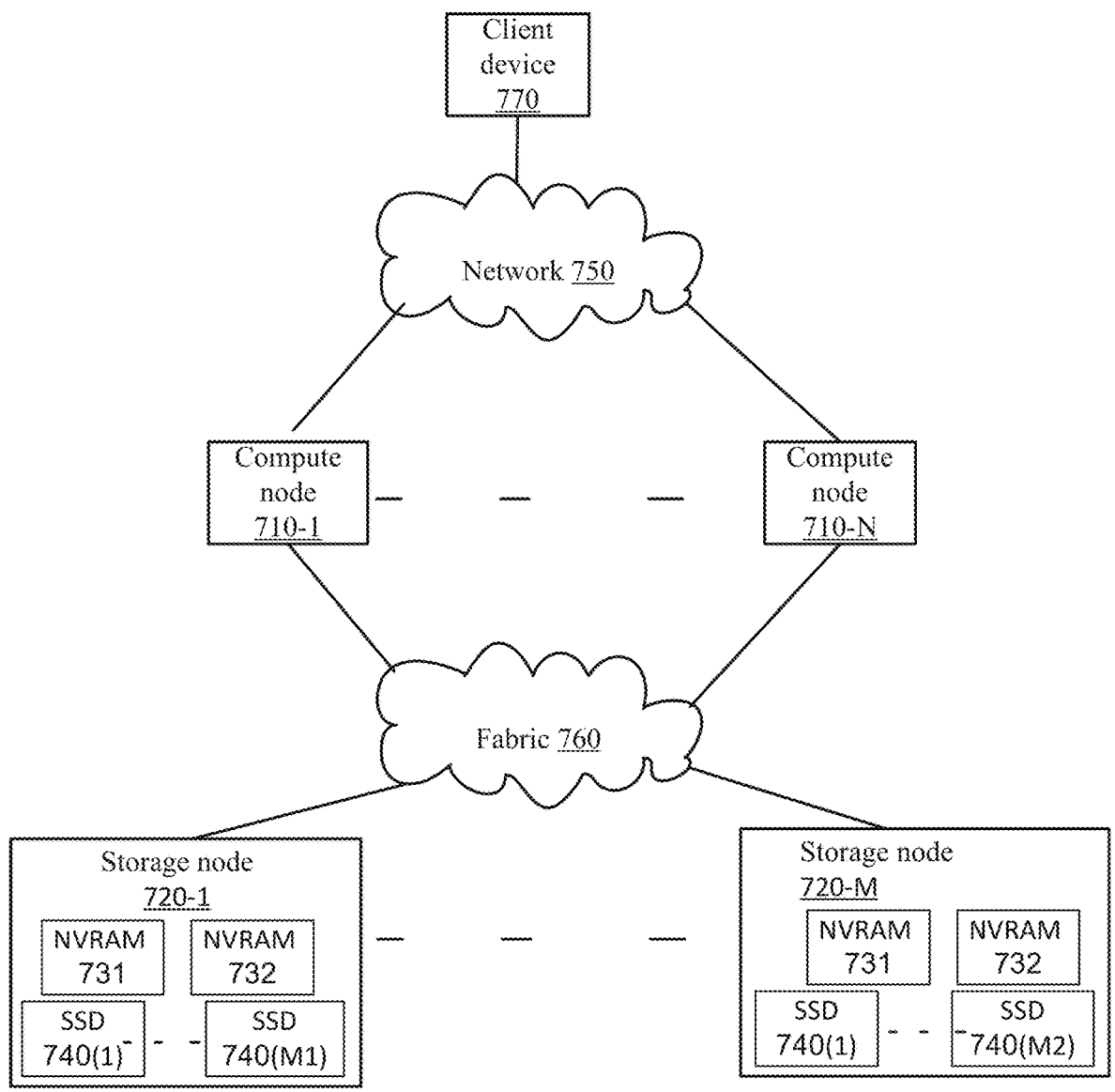
FIG. 3 is an example of a storage system.

FIG. 3 illustrates a storage system 700 that includes storage system compute elements such as multiple (N) compute nodes 710-1 to 710-N and storage resources such as multiple (M) storage nodes 720-1 to 720-M.

The storage nodes may receive and store data units in a uncompressed form, original form as received from the clients of the storage system (which may or may not be compressed by the client), in a pre-compressed form, in a compressed form and the like.

One or more storage system compute elements of the storage system may be configured to execute method 200. At least one of the pre-compression units, the compression units, the at least one entropy calculator 303, or the at least one decision unit may be implemented by one or more storage system compute elements.

The execution of method 200 may be accelerated when it is executed in parallel by multiple storage system compute elements.

The compute nodes communicate with the storage nodes via a network, such as fabric 760, and with one or more clients, such as client device 770, via network 750, may receive data units from client device 770 and send data units to client device 770. The storage nodes include various storage devices, such as NVRAM (Non Volatile Random Access Memory) 731 and 732, SSDs (Solid State Drives) 740(1)-740(M1) of storage node 720-1, and SSDs 740(1)-740(M2) of storage node 720-2.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention as claimed.

In the foregoing specification, the invention has been described with reference to specific examples of embodiments of the invention. It will, however, be evident that various modifications and changes may be made therein without departing from the broader spirit and scope of the invention as set forth in the appended claims.

Those skilled in the art will recognize that the boundaries between logic DSs are merely illustrative and that alternative embodiments may merge logic DSs or circuit elements or impose an alternate decomposition of functionality upon various logic DSs or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Any reference to "consisting", "having" and/or "including" should be applied mutatis mutandis to "consisting" and/or "consisting essentially of".

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

It is appreciated that various features of the embodiments of the disclosure which are, for clarity, described in the contexts of separate embodiments may also be provided in combination in a single embodiment. Conversely, various features of the embodiments of the disclosure which are, for brevity, described in the context of a single embodiment may also be provided separately or in any suitable sub-combination.

It will be appreciated by persons skilled in the art that the embodiments of the disclosure are not limited by what has been particularly shown and described hereinabove. Rather the scope of the embodiments of the disclosure is defined by the appended claims and equivalents thereof.

We claim:

1. A method for storage system data aware compression, the method comprises:
   pre-compressing data units received by a storage system, by different pre-compression schemes to provide different pre-compressed versions of the data units; wherein the different pre-compression schemes are associated with different compression schemes, wherein at least some of the different compression schemes are data type specific compression schemes;
   calculating entropies of the different pre-compressed versions; and
   selecting a compression scheme out of the different compression schemes based on the entropies of the different pre-compressed versions.

2. The method according to claim 1 wherein the selecting comprises evaluating whether to apply a general-purpose compression scheme or to apply one of the data type specific compression schemes.

3. The method according to claim 2 wherein the evaluating is based on a relationship between (a) a compression ratio obtained when using the general-purpose compression scheme, and (b) a compression ratio obtained when using a data type specific compression scheme.

4. The method according to claim 3 wherein the evaluating is based on an evaluation rule.

5. The method according to claim 4 comprising updating the evaluation rule based on the relationship.

6. The method according to claim 5 wherein the updating comprises tightening an entropy requirement for selecting the data type specific compression scheme when selecting to use the general-purpose compression scheme.

7. The method according to claim 5 wherein the updating comprises loosening an entropy requirement for selecting the data type specific compression scheme when selecting to use one of the data type specific compression schemes.

8. The method according to claim 1 comprising sampling data received by the storage system to provide the data units.

9. The method according to claim 8 wherein the sampling comprises applying a sampling rule, and wherein the method comprises adjusting the sampling rule according to an outcome of one or more selecting iterations.

10. The method according to claim 1 comprising compressing data units by applying the selected compression scheme.

11. A non-transitory computer readable medium for storage system data aware compression, the non-transitory computer readable medium stores instructions for:
    pre-compressing data units received by the storage system, by different pre-compression units to provide different pre-compressed versions of the data units; wherein the different pre-compression schemes are associated with different compression schemes, wherein at least some of the different compression schemes are data type specific compression schemes;
    calculating entropies of the different pre-compressed versions; and
    selecting a compression scheme out of the different compression schemes based on the entropies of the different pre-compressed versions.

12. The non-transitory computer readable medium according to claim 11 wherein the selecting comprises evaluating whether to apply a general-purpose compression scheme or to apply one of the data type specific compression schemes.

13. The non-transitory computer readable medium according to claim 12 wherein the evaluating is based on a relationship between (a) a compression ratio obtained when using the general-purpose compression scheme, and (b) a compression ratio obtained when using a data type specific compression scheme.

14. The non-transitory computer readable medium according to claim 13 wherein the evaluating is based on an evaluation rule.

15. The non-transitory computer readable medium according to claim 14 wherein comprising updating the evaluation rule based on the relationship.

16. The non-transitory computer readable medium according to claim 15 wherein the updating comprises tightening an entropy requirement for selecting the data type specific compression scheme when selecting to use the general-purpose compression scheme.

17. The non-transitory computer readable medium according to claim 15 wherein the updating comprises loosening an entropy requirement required for selecting the data type specific compression scheme when selecting to use one of the data type specific compression schemes.

18. The non-transitory computer readable medium according to claim 11 that stores instructions for sampling data received by the storage system to provide the data units.

19. The non-transitory computer readable medium according to claim 18 wherein the sampling comprises applying a sampling rule, and wherein the method comprises adjusting the sampling rule according to an outcome of one or more selecting iterations.

20. The non-transitory computer readable medium according to claim 11 that stores instructions for compressing data units by applying the selected compression scheme.

21. A storage system comprising:
    at least one storage system compute element that is configured to:
        pre-compress data units received by the storage system, by different pre-compression schemes to provide different pre-compressed versions of the data units; wherein the different pre-compression schemes are associated with different compression schemes, wherein at least some of the different compression schemes are data type specific compression schemes;

calculate entropies of the different pre-compressed versions; and select a compression scheme out of the different compression schemes based on the entropies of the different pre-compressed versions.

\* \* \* \* \*